United States Patent [19]
Schmid

[11] Patent Number: 5,914,016
[45] Date of Patent: Jun. 22, 1999

[54] APPARATUS FOR THE TREATMENT OF ARTICLES

[75] Inventor: Dieter C. Schmid, Freudenstadt, Germany

[73] Assignee: Gebr. Schmid GmbH & Co., Freudenstadt, Germany

[21] Appl. No.: 08/892,701

[22] Filed: Jul. 15, 1997

[30] Foreign Application Priority Data

Jul. 17, 1996 [DE] Germany .......................... 196 28 784

[51] Int. Cl.⁶ .................................................. C25D 17/28
[52] U.S. Cl. .......................................... 204/201; 204/202
[58] Field of Search .................................... 204/202, 199, 204/201

[56] References Cited

U.S. PATENT DOCUMENTS

| 4,755,271 | 7/1988 | Hosten | 204/202 X |
| 4,898,657 | 2/1990 | Hosten | 204/202 X |
| 4,976,840 | 12/1990 | Hosten | 204/202 |

FOREIGN PATENT DOCUMENTS

| 42 12 567 | 9/1993 | Germany . |
| 44 13 149 | 10/1995 | Germany . |
| A-946 377 | 1/1964 | United Kingdom . |
| WO 92 18669 | 10/1992 | WIPO . |

Primary Examiner—Donald R. Valentine
Attorney, Agent, or Firm—Barry R. Lipsitz

[57] ABSTRACT

In order in a continuous electroplating plant to avoid the problem of undesired metal application or metallization on contact faces (25), which e.g. occur in the case of rolling contacting of the article (13) to be plated, e.g. a printed circuit board, on contact rollers or disks (15) are provided individual contact sectors (24), which are alternately anodically and cathodically supplied with power via a commutator (27) located outside the treatment chamber (11). The contact sectors (24) are mutually overlapping and are staggered e.g. in sloping, arrow-like or step-like manner, so that a continuous contacting with respect to the article (13) is possible.

Contacting takes place in a lateral portion (45) of the treatment chamber (11), which is admittedly filled with treatment fluid (40), but is largely shielded with respect thereto, so that the metal application tendency is reduced. A partly permeable partition (56) protects the contact faces (25) from being contaminated by particles detached from the auxiliary, deplating cathode (55).

15 Claims, 2 Drawing Sheets

APPARATUS FOR THE TREATMENT OF ARTICLES

FIELD OF USE AND PRIOR ART

The invention relates to an apparatus for the treatment of articles, particularly a galvanizing apparatus for printed circuit boards, on a continuous path through a treatment chamber, with conveying means for conveying the articles through a treatment chamber, such as an electrolytic solution, and with contacting means for the electrical contacting and feeding of power from a power supply to the articles.

According to DE-A-44 13 149, the contacting means can have several, at least two, electrically mutually insulated, electrically differently contacted contact sectors circulating within the treatment medium. In the case of the construction described therein, they are alternately cathodically and anodically connectable to the power supply in the circulating direction. It is consequently possible to provide a supply of power to the articles in the cathodically contacted area. The necessarily resulting, more or less pronounced metallization of the contacting surfaces is then removed in the anodically treated area by an auxiliary, demetallizing or deplating cathode.

It is also known from DE-A-42 12 567 to grip the articles on a conveying path by means of tongs and which simultaneously are used for conveying and contacting purposes. DE-A-42 12 567 discloses a cathodic contacting by means of rotating rollers, which are supplied with power by slip rings located outside the treatment medium. They are guided on a revolving conveying system, which conveys the contact rolls at half the conveying speed of the articles through the treatment chamber. On the return path the contact rolls are anodically contacted with the opposite poll, so that the material (copper) previously deposited on the contact faces is galvanically removed again.

DE-A-25 26 006 discloses an electroplating method and apparatus, in which a strip to be plated is guided half round a roller immersed in the treatment fluid. This roller is only supplied with power in the submerged area. For this purpose the roller is provided with electrically separated segments, which are subject to action by means of a collector or commutator. The aim is to prevent sparking.

US-T-106 001 discloses an apparatus for alkalizing a substrate, in which, outside a treatment fluid, the substrate is alternately anodically and cath contacted, namely with two rollers having insulated contact segments.

OBJECT AND SOLUTION

The object of the invention is to further improve an apparatus according to DE-A-44 13 149 with regards to an even better, troublefree contacting.

For solving this problem the contact sectors are constructed circumferentially in at least partly overlapping manner. They can have e.g. sloping or step-like, electrically insulating separating lines. This ensures that there is no line contacting, i.e. the entire power supply occurs in sudden bursts over a line. The contact sectors "hand over" to one another the contacting. This system is particularly effective if it is ensured by the power introduction to the contact sectors that the two overlapping contact sectors at the time of contacting with the article are at the same potential. Commutation can then take place in such a way that in the contact area the overlapping contact sectors are connected to the power supply. Thus, if the overlapped separation point passes the article between two successive contact sectors, the latter are uniformly connected to the power supply, so that there is no power interruption with sparking or the like. Admittedly an article is normally contacted simultaneously by several moving, succeeding contact rollers or contact roller pairs, but due to the high currents and in part very thin contact layers on the articles, it can still lead to significant voltage drops within an article, so that individual contact points are in part at different potentials. Sparking or arcing during the passage of the contact segments is avoided.

The power introduction to the contact sectors preferably takes place in the manner of collectors or commutators provided with numerous sectors.

The problem is also advantageously solved in that the contacting means are placed in a contacting chamber filled with treatment medium far removed from the remaining treatment chamber and preferably acting on a galvano-edge of the articles provided for contacting purposes. In this case the guidance of the articles on the roller pairs used on the treatment path need not be provided with contact faces. Correspondingly in said application area there is no undesired galvano-application. As a result of the partial compartmentalization of the contacting area the undesired galvanic application to the contacting means is significantly reduced, so that the deplating task for said areas is made easier. The partial compartmentalization also improves the arrangement and other action of the deplating, which can also take place in said contacting chamber.

It is also advantageous to introduce a partly permeable or semipermeable partition between the contacting means and deplating cathode. This can be a mechanical compartmentalization, i.e. for example a confined or narrow screen or, preferably, a semipermeable, i.e. a membrane which is at least permeable for the ions bringing about deplating.

As a result of the partial compartmentalization of the deplating cathode it is ensured that metal which is deposited thereon in a partly uncontrolled form, drops off and is conveyed around with the treatment medium. Both in connection with the contacting of the articles and the galvano-coating of the articles and in the conveying systems problems can then arise prior to deposition or filtering off thereof. The semipermeable partition ensures that these metal particles or fragments remain in an area separate from the remaining treatment medium and can be removed therefrom.

Demetallization or deplating is very effective and leads to numerous advantages, because it permits a long useful life for the plant without any intermediate maintenance for the cleaning of contact faces and the like. When somewhat lower demands are made, the undesired metallizing of the contacting faces could also be introduced in that the flow of current, possibly through very short contact sectors in the circumferential direction and correspondingly narrow commutation, reduces the connection to the power supply to such a small area that the undesired metallization of these faces is reduced. In conjunction with the remaining measures, e.g. a substantial compartmentalization of the contacting chambers, etc., a successful result could be achieved compared with the prior art without any active demetallization or deplating.

Thus, the invention leads to a continuous galvanizing or electroplating plant, in which the problem of undesired metal application to the contact faces is avoided, which occurs in the case of rolling contacting of the article to be plated, e.g. a printed circuit board. For this purpose on contact rollers or disks individual contact sectors could be provided, which are alternately anodically and cathodically supplied with current by a commutator located outside the treatment chamber. If these mutually overlapping, e.g. displaced in sloping, arrow-shaped or step-like manner, it is possible to ensure a continuous contacting with respect to the article. Contacting can take place in a lateral portion of the treatment chamber, which is admittedly filled with the treatment fluid, but is substantially shielded with respect thereto, so that the metal application tendency is reduced. A semipermeable partition can in particular protect the contact faces from being contaminated by particles detached from the auxiliary cathode for deplating purposes.

As can be gathered from the claims, the introduction to the specification and the statements made hereinafter, the application of the invention is not restricted to the deposition of metals from the electrolyte on articles. In the case of a corresponding polarity reversal, the apparatus according to the invention can also be used for metal removal, i.e. for transferring metal ions into electrolytes, as well as for electrolytic degreasing.

These and further features can be gathered from the claims, description and drawings, the individual features, either singly or in the form of subcombinations, being implementable in an embodiment of the invention and in other fields and can represent advantageous, independently protectable constructions for which protection is hereby claimed. The subdivision of the application into individual sections and the subtitles in no way restrict the general validity of the statements made thereunder.

BRIEF DESCRIPTION OF THE DRAWINGS

Embodiments of the invention are described in greater detail hereinafter relative to the attached drawings, wherein show.

DESCRIPTION OF A PREFERRED EMBODIMENT

Figure 1:
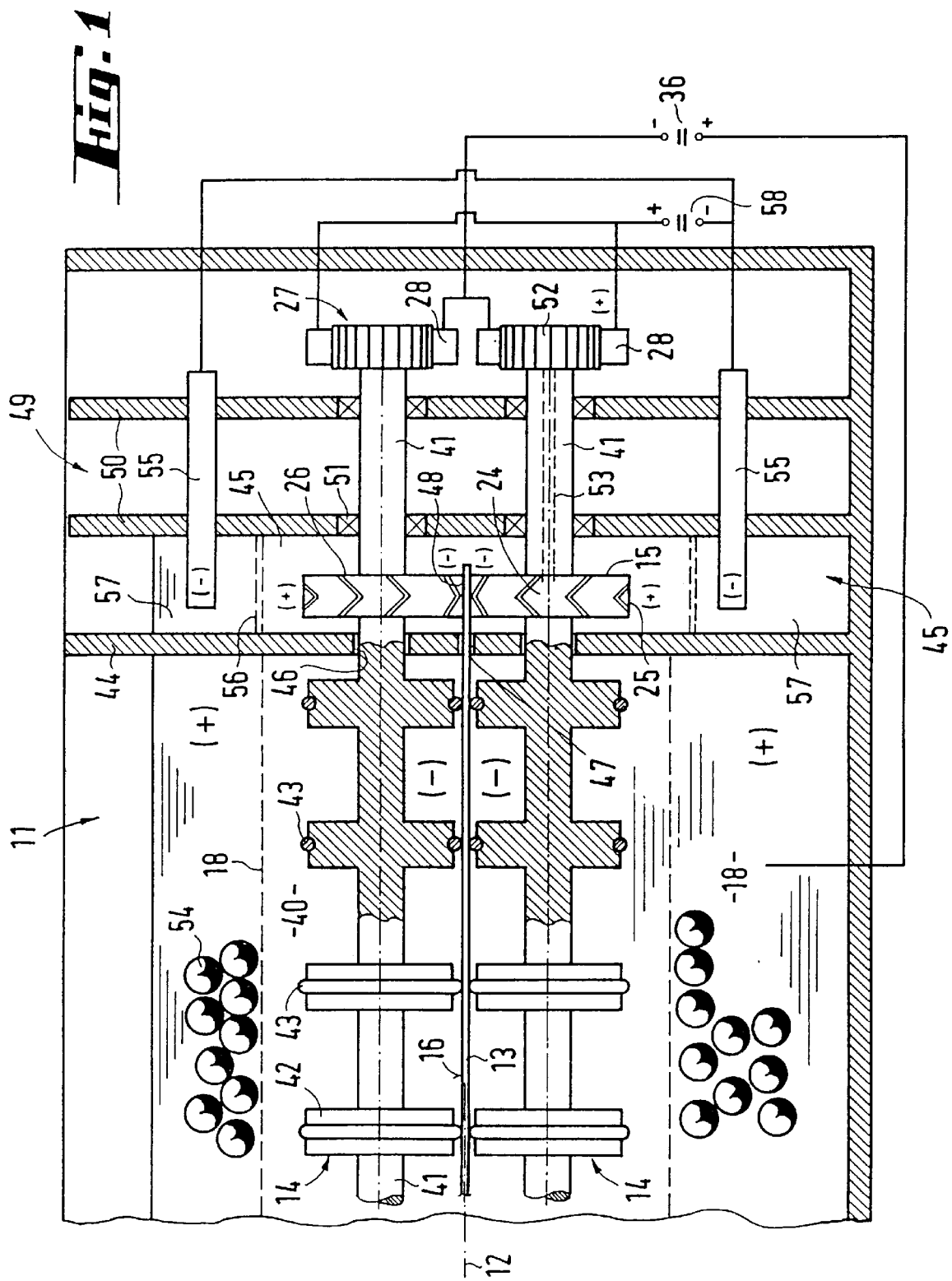
FIG. 1 A diagrammatic partial cross-section through a plating apparatus.

FIG. 1 diagrammatically shows part of a plating or electroplating apparatus with a treatment chamber, which is filled with a treatment medium 40, e.g. an electrolytic solution. In the elongated treatment chamber is provided a generally horizontal continuous path 12 (perpendicular to the plane of the drawing) for the articles 13 to be treated, e.g. printed circuit boards. They are conveyed horizontally on the continuous path through the treatment chamber 11. The continuous path 12 is formed by conveying means 14 in the form of conveying rollers or wheels, which in the present case are formed by disks 42 projecting from a plastic shaft 41. They face one another in pairs and contact the articles 13 by means of an elastic, circumferential projection, which is constructed in the embodiment as an O-ring 43 inserted in a groove of the disk 42.

The articles 13 are covered with an electrically conductive coating 16, which is e.g. in the form of a copper cladding on the base material of the article. The inner face of bores provided in the articles is previously made electrically conductive, e.g. by chemical metal deposition. The electrically conductive coating on the articles and in their bores can also comprise an electrically conductive polymer, e.g. a corresponding plastic, or also graphite or the like.

The shafts 41 of the oppositely driven conveying means 14 arranged in pairs at short intervals above and below the continuous path, project through a partition 44, which substantially separates a contacting chamber 45 from the remaining treatment chamber 11. However, it is connected thereto by the passage openings 46 for the shafts 41 and by an elongated slot 47 through which the article 13 projects into the contacting chamber.

In the marginal area in the contacting chamber 44, the article 13 has a so-called galvano-edge 48, i.e. an area mainly provided for continuous contacting during plating.

The contacting chamber 45 is sealed to the outside by a sealing area 49, to which belong e.g. two intermediate walls 50 through which the shafts 41 project in a largely sealed manner. This area can also contain the drive for the conveying means 14, e.g. in the form of bevel gears, which are driven by a common shaft. For simplification purposes they are not shown here, which also applies to the sealing systems, which can e.g. operate in the form of a labyrinth seal, but only the elements 51 are diagrammatically shown in the drawing.

Adjacent to the sealing area is located on each shaft 41 a power feed means 27 in the manner of a commutator, which is supplied by current leads 28 in the manner of commutator brushes.

The individual commutator sectors 52 are electrically connected to contact sectors 24 on contacting means 15, e.g. by conductor rails 53 in the shaft 41 running in concealed manner beneath a plastic sleeve. The contacting means 15 in each case comprise a disk located on the shaft 41, so that two of these disks face one another in pairs and bilaterally contact the galvano-edge 48 and are in contact with their contact faces 25. The contacting means 15 are located in the contacting chamber 45 and are largely separated from the treatment chamber 11, in which in anodically connected anode cages 18 is located the metal to be galvanically applied in the form of balls 54, e.g. copper balls.

The contact sectors or segments 24 are so constructed that two adjacent sectors overlap, in that the insulating sector 26 provided between them is inclined to the shaft axis and according to FIG. 1 V-shaped. The number of commutator sectors 52 can correspond to that of the contact sectors 24, but it is also possible to have a different spacing if the terminals or connections are in part combined.

In the contacting chamber 45 are provided auxiliary, demetallizing or deplating cathodes 55, which are as close as possible to the portions of the contact means 7 remote from the article 13. A partly permeable or semipermeable partition 56 is provided here between the deplating cathodes 55 and the surface 25 of the contact means. It can e.g. comprise a semipermeable membrane, e.g. of polypropylene or other mechanically relatively stable membranes, which are intrinsically semipermeable or made semipermeable by a corresponding treatment. They admittedly allow the flow of current and ion migration from the surface 24 to the cathode 55, but prevent particles which have formed on the cathode 55 and have become detached therefrom, from entering the treatment medium 40 outside the deplating area 57 shielded by the partly permeable partitions 56.

FUNCTION

The articles 13 guided by the conveying means 14 horizontally through the treatment chamber 11 filled with treatment medium 40 are conveyed by the oppositely driven conveying means and simultaneously contacted on their surface layer by the contact sectors 24 of the contacting means 15.

In each case in the portion close to the article 13 they are in contact with the negative pole of a power supply 36 controlled by the power supplies 28 formed in the manner of carbon brushes or the like to the associated commutator sectors 52. In the areas remote from the article 13 the contact sectors 24 are connected via corresponding commutator sectors 52 and power leads 28 to the positive pole of a deplating power supply 58. The positive pole of the plating power supply 36 is connected to the anode cages 18 and the negative pole of the deplating power supply 58 to the deplating cathodes.

On the surface of the article 16 and to a certain extent also on the contact sectors, to the extent that they are cathodically connected, metal from the electrolyte is deposited, whilst the metal balls 54 located in the anodes simultaneously transfer metal ions into the electrolyte, i.e. "dissolve" the same. However, simultaneously in the area remote from the article 13, a part of the contact sectors 24 is also anodically connected, so that metal from the contact faces 25 undesirably passes into the electrolyte, namely that previously deposited thereon during cathodic contacting. Thus, said faces are constantly and immediately following onto their undesired metallization, demetallized again. Through a corresponding choice of the material of the contact sectors, e.g. graphite, high-grade steel, titanium, platinum, etc., a removal of the contact sectors can be prevented. Thus, as a result of the overall structure of the apparatus limited, but not completely avoidable galvanic metallization of the contacting faces is subsequently removed again.

During demetallization the metal ions, under the influence of the power applied by the demetallizing power supply 58, migrate through the semipermeable partition 56. On the demetallizing cathode 55 is formed a metal layer, which is frequently not uniform and instead occurs in the form of "wild growth". If metal parts are detached therefrom, they remain in the area 57 shielded by the partitions 56. This area 57, like the complete treatment chamber, is filled with treatment fluid to above the anodes 18 and cathode 55.

FURTHER EMBODIMENTS

Figures 2, 3:
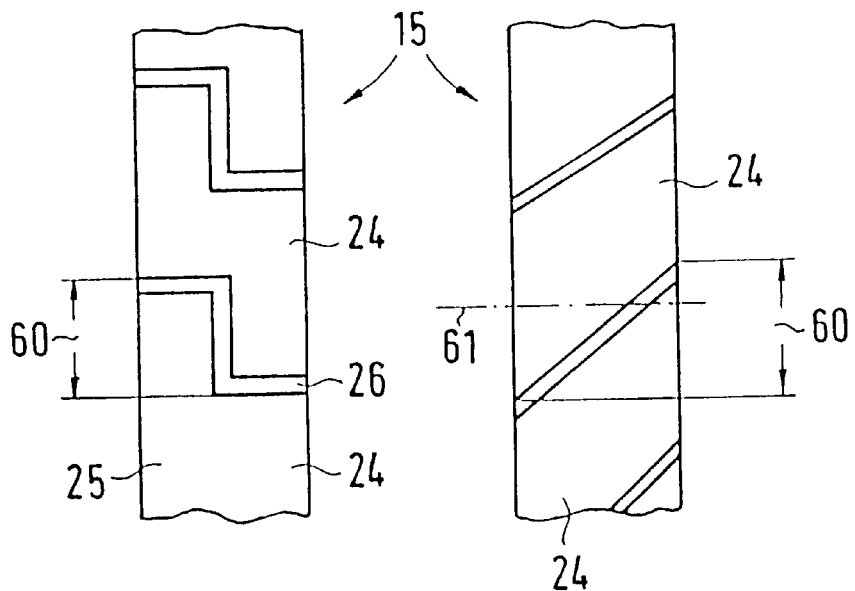
FIGS. 2 & 3 Details of the surface of the contacting means.

FIG. 2 shows a portion of the circumferential surface 25 of the contacting means 15. The contact sectors 24 formed thereon are in each case constructed in Z-shaped interengaging manner, in that they are separated from one another by Z-shaped insulating sectors 26. Thus, there is an overlap area 60, in which adjacent sectors 24 can simultaneously contact the article.

The same applies for FIG. 3, where the insulating sectors 26 are constructed in the form of strips sloping towards the axial direction 61, so that also the contact sectors 24 have a rhombic construction and an overlap area 60 forms. Thus, the contact sectors can have in the circumferential direction random, optionally curved boundaries, in order to achieve the desired overlapping contacting also achieved in the embodiment according to FIG. 1.

Figure 4:
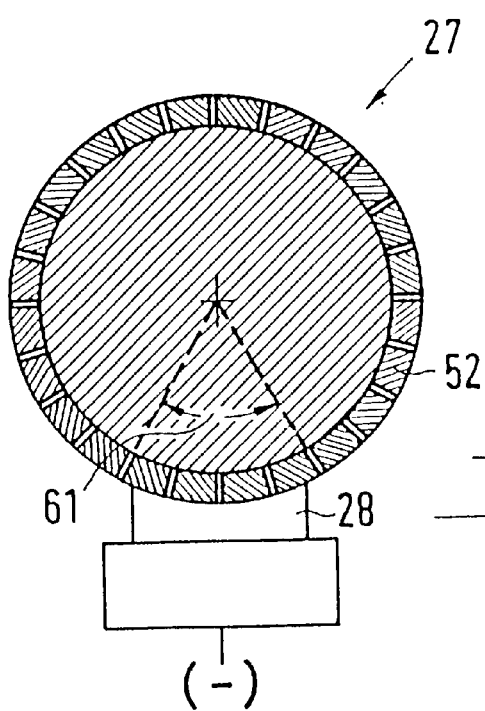
FIG. 4 A commutator for introducing power into the contacting means.

FIG. 4 shows a power introduction means 27 in the form of a commutator with relatively few commutator sectors 52, which are only contacted in a relatively small angular area 61 by the current or power introduction means 28 constructed in the manner of carbon brushes. This area should be chosen as a function of the size of the commutator sectors and therefore also the correspondingly finely distributed contact sectors 24 on the contact means in such a way that it is largely limited to the contact zone of the contact sectors 24 with the article 13. The remaining areas of the contact sectors 24 are therefore dead and also have no self-metallization tendency. This is assisted by the arrangement of the contacting means 15 in the substantially shielded contacting chamber.

I claim:

1. Apparatus for the treatment of articles on a continuous path through a treatment chamber adapted to contain a treatment medium, comprising:

conveying means for conveying the articles through the treatment chamber; and contacting means for electrical contacting and electric current feeding from an electric current supply to the articles, the contacting means having at least two mutually electrically insulated, electrically differently contacted contact sectors circulating in a circumferential direction in the treatment chamber, the contact sectors being arranged in an at least partly overlapping manner in the circumferential direction.

2. Apparatus according to claim 1, wherein the apparatus is a galvanizing apparatus for printed circuit boards and the treatment medium is an electrolytic solution.

3. Apparatus according to claim 1, wherein the contacting means are rollers rotating around an axis; the contact sectors having insulating sectors electrically separating the contact sectors from one another, the insulating sectors being at least partly directed in another direction than parallel to the roller axis.

4. Apparatus according to claim 1, wherein the current supply is adapted to feed current to a contacting area, the area comprising the at least two mutually overlapping contact sectors.

5. Apparatus according to claim 1, wherein the current supply includes commutators provided with numerous commutator sectors.

6. Apparatus according to claim 1, further comprising means to connect those of the contact sectors being not in contact with the articles to a polarity opposite to that of the articles and comprising a deplating cathode for deplating the contact sectors.

7. Apparatus for the treatment of articles on a continuous path through a treatment chamber adapted to contain a treatment medium, comprising:

conveying means for conveying the articles through the treatment chamber; and contacting means for electrical contacting and electric current feeding from an electric current supply to the articles; and a deplating cathode, wherein a partly permeable partition is situated between the contacting means and the delating cathode, the partition being adapted to allow flow of current and ion migration resulting therefrom between the contacting means and the deplating cathode, but preventing particles formed at the cathode to enter the treatment chamber outside an area between the partition and the deplating cathode.

8. Apparatus according to claim 7, wherein the partition is a membrane at least permeable for ions.

9. Apparatus according to claim 7, wherein the apparatus is a galvanizing apparatus for printed circuit boards and the treatment medium is an electrolytic solution.

10. Apparatus for the treatment of articles on a continuous path through a treatment chamber adapted to contain a treatment medium, comprising:

conveying means for conveying the articles through the treatment chamber; and contacting means for electrical contacting and electric current feeding from an electric current supply to the articles; the contacting means being positioned in a contacting chamber largely separated from the remaining treatment chamber, but adapted to be filled with treatment medium.

11. Apparatus according to claim 10, wherein the contacting means are positioned to contact a contact rim of the articles provided thereon for contacting purposes.

12. Apparatus according to claim 10, wherein the apparatus is a galvanizing apparatus for printed circuit boards and the treatment medium is an electrolytic solution.

13. Apparatus for the treatment of articles on a continuous path through a treatment chamber adapted to contain a treatment medium, comprising:

conveying means for conveying the articles through the treatment chamber; and contacting means for electrical contacting and electric current feeding from an electric current supply to the articles, the contacting means having at least two mutually electrically insulated, electrically differently contacted contact sectors circulating in the circumferential direction in the treatment chamber wherein only those contact sectors are connected to the current supply which mechanically contact the articles.

14. Apparatus according to claim 13, wherein the contact sectors are arranged in an at least partly overlapping manner in the circumferential direction.

15. Apparatus according to claim 13, wherein the apparatus is a galvanizing apparatus for printed circuit boards and the treatment medium is an electrolytic solution.

* * * * *